(12) United States Patent
Sham et al.

(10) Patent No.: US 9,825,650 B2
(45) Date of Patent: Nov. 21, 2017

(54) DECODER ARCHITECTURE FOR CYCLICALLY-COUPLED QUASI-CYCLIC LOW-DENSITY PARITY-CHECK CODES

(71) Applicant: THE HONG KONG POLYTECHNIC UNIVERSITY, Hong Kong (HK)

(72) Inventors: Chiu-Wing Sham, Hong Kong (HK); Jianfeng Fan, Hong Kong (HK); Wai Man Tam, Hong Kong (HK); Qing Lu, Hong Kong (HK); Chung Ming Lau, Hong Kong (HK)

(73) Assignee: The Hong Kong Polytechnic University, Hong Kong (HK)

( * ) Notice: Subject to any disclaimer, the term of this patent is extended or adjusted under 35 U.S.C. 154(b) by 120 days.

(21) Appl. No.: 14/826,161

(22) Filed: Aug. 13, 2015

(65) Prior Publication Data
US 2016/0142074 A1  May 19, 2016

(30) Foreign Application Priority Data
Nov. 19, 2014  (CN) .......................... 2014 1 0662824

(51) Int. Cl.
 *H03M 13/11* (2006.01)
 *H03M 13/00* (2006.01)
 *H04L 1/00* (2006.01)

(52) U.S. Cl.
 CPC ........ *H03M 13/116* (2013.01); *H03M 13/114* (2013.01); *H03M 13/1111* (2013.01);
 (Continued)

(58) Field of Classification Search
 CPC ......... H03M 13/1102; H03M 13/1105; H03M 13/1111; H03M 13/1134; H03M 13/114;
 (Continued)

(56) References Cited

U.S. PATENT DOCUMENTS

2012/0284583 A1* 11/2012 Tran .................... H03M 13/1117
 714/752
2014/0101510 A1* 4/2014 Wang .................... H03M 13/09
 714/758

OTHER PUBLICATIONS

Costello, D.J. Jr., et al., "A Comparison Between LDPC Block and Convolutional Codes," Proceedings of Information Theory and Applications Workshop, San Diego, CA, USA, Feb. 6-10, 2006.
(Continued)

*Primary Examiner* — Albert Decady
*Assistant Examiner* — Christian Dorman
(74) *Attorney, Agent, or Firm* — Spruson & Ferguson (HK)

(57) ABSTRACT

This invention provides a cyclically-coupled (CC-) quasi-cyclic (QC-) low-density parity-check (LDPC) code and its decoder architecture. The essence of the invention is to introduce the convolutional nature to a plurality of individual block codes internally so as to form a resultant block code with a prolonged code length while slightly increasing the hardware complexity in decoder realization. The CC-QC-LDPC code is formed by cyclically coupling a plurality of sub-codes each being a QC-LDPC code such that overlapping of some variable nodes between two consecutive sub-codes results. The decoder comprises plural sub-decoders each configured to decode the channel messages for one sub-code. The sub-decoders are arranged in a ring shape such that an individual sub-decoder is configured to communicate edge messages with two neighboring sub-decoders adjacent to said individual sub-decoder in the decoding of the channel messages. The sub-decoders are configured to operate concurrently for simultaneously decoding individual sub-codes.

9 Claims, 15 Drawing Sheets

(52) U.S. Cl.
CPC ..... *H03M 13/1154* (2013.01); *H03M 13/616* (2013.01); *H03M 13/6561* (2013.01); *H04L 1/0052* (2013.01); *H04L 1/0045* (2013.01)

(58) Field of Classification Search
CPC ......... H03M 13/1145; H03M 13/1154; H03M 13/116; H03M 13/1162; H03M 13/616; H03M 13/6561; H04L 1/004; H04L 1/0045; H04L 1/0052
See application file for complete search history.

(56) References Cited

OTHER PUBLICATIONS

Huang, Q. et al., "Cyclic and Quasi-Cyclic LDPC Codes: New Developments," Proceedings of 2011 Information Theory and Applications Workshop (ITA), pp. 1-10, Feb. 6-11, 2011.
Liu, K. et al., "Quasi-Cyclic LDPC Codes: Construction and Rank Analysis of Their Parity-Check Matrices," Proceedings of 2012 Information Theory and Applications Workshop (ITA), pp. 227-233, Feb. 5-10, 2012.

* cited by examiner

State 1

State 2

State 3

State 4

FIG. 8A

| | $V_1$ | $V_2$ | $V_3$ | $V_4$ | $V_5$ | $V_6$ | $V_7$ | $V_8$ | $V_9$ | $V_{10}$ | $V_{11}$ | $V_{12}$ | $V_{13}$ | $V_{14}$ | $V_{15}$ | $V_{16}$ | $V_{17}$ | $V_{18}$ |
|---|---|---|---|---|---|---|---|---|---|---|---|---|---|---|---|---|---|---|
| $C_1$ | 1 | | | | 1 | | | | 1 | | 1 | | | | | | | |
| $C_2$ | | 1 | | | | 1 | 1 | | | | | 1 | | | | | | |
| $C_3$ | | | 1 | 1 | | | | 1 | | 1 | | | | | | | | |
| $C_4$ | | | 1 | 1 | | | | 1 | | | | 1 | | | | | | |
| $C_5$ | 1 | | | | 1 | | | | 1 | 1 | | | | | | | | |
| $C_6$ | | 1 | | | | 1 | 1 | | | | 1 | | | | | | | |
| $C_7$ | | | | | | | 1 | | | | | | 1 | | | 1 | | |
| $C_8$ | | 1 | | | | | | 1 | | | | | | 1 | | | 1 | |
| $C_9$ | | | 1 | | | | | | 1 | | | | | | 1 | | | 1 |
| $C_{10}$ | | | | | | | | | | 1 | | | 1 | | | 1 | | |
| $C_{11}$ | 1 | | | | | | | | | | 1 | | | 1 | | | 1 | |
| $C_{12}$ | | | | | | 1 | | | | | | 1 | | | 1 | | | 1 |

Sub-code a: $V_1 ... V_{12}$
Sub-code b: $V_{13} ... V_{18}$

| RAM$_a$,1 | RAM$_a$,3 | RAM$_a$,5 | RAM$_a$,7 | RAM$_a$,9 |
|---|---|---|---|---|
| $V_1$2$C_1$ | $C_1$2$V_1$ | $V_5$-$C_1$ | $V_9$-$C_1$ | $V_{11}$-$C_1$ |
| $V_2$2$C_2$ | $C_2$2$V_2$ | $V_6$-$C_2$ | $V_7$-$C_2$ | $V_{12}$-$C_2$ |
| $V_3$2$C_3$ | $C_3$2$V_3$ | $V_4$-$C_3$ | $V_8$-$C_3$ | $V_{10}$-$C_3$ |

| RAM$_a$,2 | RAM$_a$,4 | RAM$_a$,6 | RAM$_a$,8 | RAM$_a$,10 |
|---|---|---|---|---|
| $V_2$2$C_4$ | $C_4$2$V_2$ | $V_4$-$C_4$ | $V_9$-$C_4$ | $V_{12}$-$C_4$ |
| $V_3$2$C_5$ | $C_5$2$V_3$ | $V_5$-$C_5$ | $V_7$-$C_5$ | $V_{10}$-$C_5$ |
| $V_1$2$C_6$ | $C_6$2$V_1$ | $V_6$-$C_6$ | $V_8$-$C_6$ | $V_{11}$-$C_6$ |

| RAM$_b$,1 | RAM$_b$,3 | RAM$_b$,5 | RAM$_b$,7 | RAM$_b$,9 |
|---|---|---|---|---|
| $V_{10}$2$C_7$ | $C_7$2$V_{10}$ | $V_{14}$-$C_7$ | $V_{18}$-$C_7$ | $V_2$-$C_7$ |
| $V_{11}$2$C_8$ | $C_8$2$V_{11}$ | $V_{15}$-$C_8$ | $V_{16}$-$C_8$ | $V_3$-$C_8$ |
| $V_{12}$2$C_9$ | $C_9$2$V_{12}$ | $V_{13}$-$C_9$ | $V_{17}$-$C_9$ | $V_1$-$C_9$ |

| RAM$_b$,2 | RAM$_b$,4 | RAM$_b$,6 | RAM$_b$,8 | RAM$_b$,10 |
|---|---|---|---|---|
| $V_{11}$2$C_{10}$ | $C_{10}$2$V_{11}$ | $V_{13}$-$C_{10}$ | $V_{18}$-$C_{10}$ | $V_3$-$C_{10}$ |
| $V_{12}$2$C_{11}$ | $C_{11}$2$V_{12}$ | $V_{14}$-$C_{11}$ | $V_{16}$-$C_{11}$ | $V_1$-$C_{11}$ |
| $V_{10}$2$C_{12}$ | $C_{12}$2$V_{10}$ | $V_{15}$-$C_{12}$ | $V_{17}$-$C_{12}$ | $V_2$-$C_{12}$ |

$V_i 2 C_j$: V2C message from variable node $V_i$ to check node $C_j$
$C_j 2 V_i$: C2V message from check node $C_j$ to variable node $V_i$
$V_i$-$C_j$: edge message between variable node $V_i$ and check node $C_j$
$CM_i$: the channel message for variable node $V_i$

| RAM$_b$13 | RAM$_a$11 | RAM$_a$12 | RAM$_a$13 | RAM$_b$11 | RAM$_b$12 |
|---|---|---|---|---|---|
| $CM_1$ | $CM_4$ | $CM_7$ | $CM_{10}$ | $CM_{13}$ | $CM_{16}$ |
| $CM_2$ | $CM_5$ | $CM_8$ | $CM_{11}$ | $CM_{14}$ | $CM_{17}$ |
| $CM_3$ | $CM_6$ | $CM_9$ | $CM_{12}$ | $CM_{15}$ | $CM_{18}$ |

US 9,825,650 B2

DECODER ARCHITECTURE FOR CYCLICALLY-COUPLED QUASI-CYCLIC LOW-DENSITY PARITY-CHECK CODES

CROSS-REFERENCE TO RELATED APPLICATIONS

This application claims priority to China Invention Patent Application No. 201410662824.5, filed on Nov. 19, 2014, the disclosure of which is hereby incorporated by reference in its entirety.

LIST OF ABBREVIATIONS

APP a posteriori probability
ASIC application-specific integrated circuit
BER bit error rate
BP belief propagation
C2V check-to-variable
CC-QC-LDPC cyclically-coupled QC-LDPC
CNP check-node processor
CNPU check-node processing unit
DSP digital signal processor
FEC forward error correction
FPGA field programmable gate array
LDPC low-density parity-check
LDPCCC LDPC convolutional code
LLR log-likelihood ratio
LUT look-up table
QC-LDPC quasi-cyclic LDPC
RAM random access memory
SNR signal-to-noise ratio
V2C variable-to-check
VNP variable-node processor
VNPU variable-node processing unit

BACKGROUND

Field of the Invention

The present invention generally relates to error-correcting coding using a class of LDPC codes. In particular, the present invention relates to CC-QC-LDPC codes formed by cyclically coupling plural sub-codes, each being a QC-LDPC code, with an advantage of low decoder complexity while achieving an error performance comparable to an LDPCCC.

Description of Related Art

Development of more superior FEC methods is inevitable in the advancement of communication technologies. In the spectrum of limit-approaching techniques, LDPC codes form a promising and interesting candidate that has been proved over the years. It is also noticed that LDPC codes are adopted in more and more digital communication systems.

Plenty of LDPC decoders were proposed, resulting in various implementation achievements. A decoder for a 9216-bit 1/2-rate code was implemented onto an FPGA and its partially parallel architecture achieved a 54 Mbps throughput. Another design used an 8176-bit code and extended the throughput towards 175 Mbps at a 193 MHz clock rate. Thereafter, a design with a 4.7 Gbps throughput, though not really implemented, was even proposed while the code length was thousands of bits. Usually, an LDPC block code cannot be very long; otherwise the decoder complexity becomes very high. As a result, it limits the error performance of LDPC block codes in the waterfall region and produces an error floor that occurs in the high signal-to-noise region. LDPCCCs, compared to LDPC block codes, have better error performance in the waterfall region and are very effective in lowering the error floor. A comparison between LDPC block codes and LDPCCCs is given by COSTELLO, D. J. Jr., et al., "A Comparison Between LDPC Block and Convolutional Codes," *Proceedings of Information Theory and Applications Workshop*, San Diego, Calif., USA, Feb. 6-10, 2006, the disclosure of which is incorporated by reference herein in its entirety. An overview of LDPCCCs is also given by COSTELLO et al. Theoretically, LDPCCCs have an infinite length. Yet, the decoder is required to handle and process only one data segment at a time. By keeping the parity-check information in memory, decoding can be performed in a continual manner. Though the LDPCCC decoder is not very complex, it requires a significantly larger amount of storage when compared to an LDPC block decoder. Moreover, the storage space increases linearly with the number of decoding iterations.

It is advantageous if one can design an LDPC code having a long code length so as to achieve a performance comparable to an LDPCCC but a corresponding decoder of this LDPC code can be implemented with a complexity lower than that of the LDPCCC. There is a need in the art for this LDPC code.

SUMMARY OF THE INVENTION

A first aspect of the present invention is to provide a method for encoding a bit sequence of length k to introduce error-correcting capability to the bit sequence. According to the method, one or more processors generate a codeword from the bit sequence by computing $d=G^T b$, where d is the codeword expressed as a length-n column vector, b is the bit sequence expressed as a length-k column vector, and G is a k×n generator matrix of an error-correcting block code. The error-correcting block code is formed by K sub-codes, each being a QC-LDPC code, for a pre-determined value of K. In particular, the error-correcting block code has a parity-check matrix H of size (n−k)×n given by (1) below. For $i \in \{1, \ldots, K\}$, $H_l^i$, $H_m^i$ and $H_r^i$ in (1) are non-zero submatrices and $[H_l^i\ H_m^i\ H_r^i]$ is a parity-check matrix of the ith sub-code. The parity-check matrices of all the K sub-codes have the same size. The generator matrix is determined such that $HG^T=0$ is satisfied. The error-correcting block code that is formed is a CC-QC-LDPC code.

As one option, each of the parity-check matrices of the K sub-codes consists of equal-size submatrices each of which is a circulant identity matrix.

The parity-check matrices of the K sub-codes may or may not be distinct.

The submatrix $H_l^i$ may be different from $H_r^i$ in the number of columns for at least one value of $i \in \{1, \ldots, K\}$.

Optionally, the method further comprises puncturing the codeword to generate a shortened codeword.

A second aspect of the present invention is to provide a digital-communication method for transmitting a bit sequence of length k from a sender to a receiver over a channel is provided. According to the method, one or more processors of the sender encodes the bit sequence to introduce error-correcting capability thereto by generating a codeword of length n from the bit sequence as set forth in any embodiment of the CC-QC-LDPC code disclosed herein. The sender then forwards the codeword to the receiver via the channel. The receiver receives the codeword from the channel so that the receiver obtains a received codeword that is a copy of the codeword corrupted with channel noise. Thereafter, one or more processors of the receiver decodes the received codeword according to H.

In one option, the one or more processors of the sender, before the codeword is transmitted over the channel, shorten the codeword originally of length n to a length of less than n by puncturing the length-n codeword at one or more selected bit positions. Correspondingly, the one or more processors of the receiver expand the received codeword originally of length less than n to a length of n by depuncturing before the received codeword is decoded.

A third aspect of the present invention is to provide a decoder for decoding received channel messages of codeword bits. The codeword bits are encoded by a CC-QC-LDPC code as disclosed herein. Hence, the CC-QC-LDPC code is formed by plural sub-codes, each of which is a QC-LDPC code, with overlapping of variable nodes between two consecutive sub-codes.

The decoder comprises a plurality of sub-decoders. The number of the sub-decoders is the same as the number of the sub-codes. Each sub-decoder is configured to decode the channel messages for one sub-code. The sub-decoders are arranged in a ring shape such that an individual sub-decoder is configured to communicate edge messages with two neighboring sub-decoders adjacent to said individual sub-decoder in the decoding of the channel messages. Furthermore, the sub-decoders are configured to operate concurrently for simultaneously decoding individual sub-codes.

Preferably, the decoder further comprises a global controller. The global controller comprises an address controller and a multiplexing controller. The address controller is for performing memory address management fulfilled by counters. The multiplexing controller is used for switching connections between the layered decoders and the RAM blocks, and connections between the counters and the RAM blocks.

It is also preferable that each sub-decoder comprises a plurality of layered decoders and a plurality of RAM blocks. Each layered decoder is configured to receive the channel messages and the edge messages, and to update the edge messages and make final decisions. Furthermore, each layered decoder comprises CNPs for updating C2V messages, and VNPs for updating V2C messages. The C2V messages and the V2C messages are updated iteratively, thereby enabling each layered decoder to perform iterative decoding. The iterative decoding may be performed by executing a preset number of iterations in updating the C2V messages and the V2C messages. The plurality of RAM blocks is used for storing messages corresponding to variable nodes associated with said one sub-code for which said each sub-decoder is configured to decode the channel messages.

The RAM blocks may be utilized as follows.

A first portion of the RAM blocks stores V2C messages corresponding to variable nodes co-owned by two adjacent sub-codes. The two sub-decoders each for decoding one of said two adjacent sub-codes are configured such that each of the RAM blocks in the first portion is read and written respectively by said two sub-decoders.

A second portion of the RAM blocks stores C2V messages corresponding to the variable nodes co-owned by two adjacent sub-codes. The two sub-decoders each for decoding one of said two adjacent sub-codes are configured such that each of the RAM blocks in the second portion is read and written respectively by said two sub-decoders.

A third portion of the RAM blocks stores edge messages corresponding to variable nodes of said one sub-code. Said each sub-decoder is configured to read and write each of the RAM blocks in the third portion.

A fourth portion of the RAM blocks stores channel messages corresponding to variable nodes of said one sub-code. Said each sub-decoder is configured such that each of the RAM blocks in the fourth portion is read by said sub-decoder and loaded only after decoding of the channel messages is finished.

In one option, each of the CNPs comprises parallel processing units that are LUT arrays with parallel routing. In another option, each of the VNPs comprises parallel processing units that are adder arrays.

Other aspects of the present invention are disclosed as illustrated by the embodiments hereinafter.

BRIEF DESCRIPTION OF THE DRAWINGS

The features and advantages of the present invention will be apparent from the following detailed description of the invention with reference to the accompanied drawings in which:

FIG. 8A is the parity-check matrix of a CC-QC-LDPC code example and the corresponding RAM assignment;

DETAILED DESCRIPTION

The present invention is concerned with a novel type of LDPC block codes and a decoder architecture thereof. The new type of LDPC block codes as disclosed herein is a CC-QC-LDPC code. The CC-QC-LDPC code can provide an error performance comparable with that of an LDPCCC. A major advantage of the CC-QC-LDPC code is that its decoder architecture is significantly much lower in complexity than a corresponding decoder of the LDPCCC under a condition of achieving a similar BER. The essence of the invention is to introduce the convolutional nature to a plurality of individual block codes internally (each being called a sub-code) so as to form a resultant block code with a prolonged code length while slightly increasing the hardware complexity in decoder realization.

An example CC-QC-LDPC code having a code length of 98304 bits was successfully implemented on a FPGA and investigated for its error performance, architectural complexity and overall throughput. It has been observed that the CC-QC-LDPC code as disclosed herein substantially departs from previous designs concerning LDPC block codes and provides a solution to high-quality decoding primarily achievable only by LDPCCCs.

A. Code Construction

The construction of a CC-QC-LDPC code is illustrated as follows.

Figure 1:
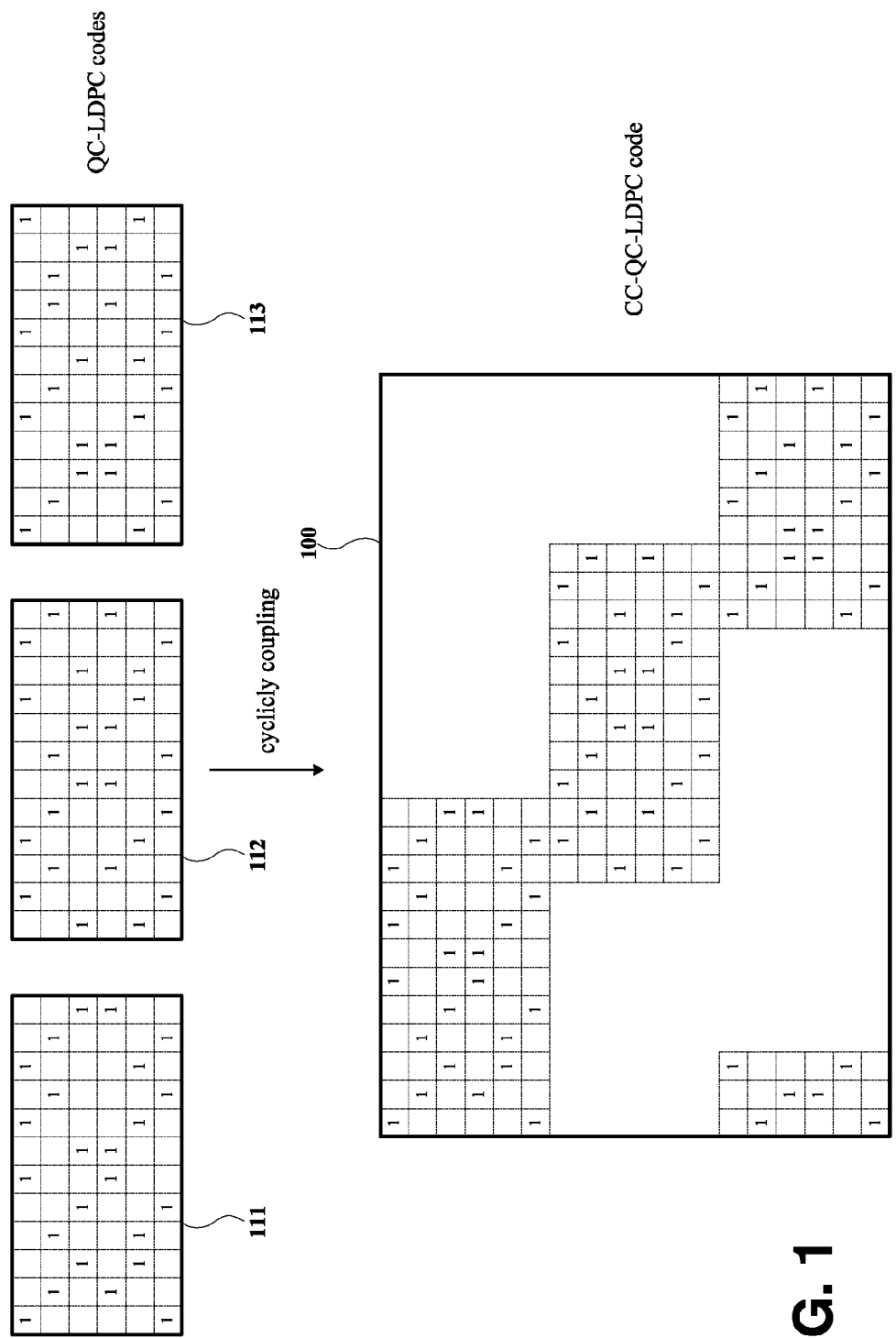
FIG. 1 is an illustrative example showing the construction process of a CC-QC-LDPC code according to an exemplary embodiment of the present invention.

Refer to FIG. 1, which depicts one construction of the CC-QC-LDPC code as an example for illustration. A CC-QC-LDPC code 100 is formed by cyclically coupling three QC-LDPC codes 111, 112, 113 (each being called as a sub-code) such that overlapping of some variable nodes between two consecutive sub-codes is present. Articles providing overviews of QC-LDPC codes include: HUANG, Q. et al., "Cyclic and Quasi-Cyclic LDPC Codes: New Developments," *Proceedings of* 2011 *Information Theory and Applications Workshop (ITA)*, pp. 1-10, Feb. 6-11, 2011; and LIU, K. et al., "Quasi-Cyclic LDPC Codes: Construction and Rank Analysis of Their Parity-Check Matrices," *Proceedings of* 2012 *Information Theory and Applications Workshop (ITA)*, pp. 227-233, Feb. 5-10, 2012. Each of the disclosures of the aforementioned articles is incorporated by reference herein in its entirety. Although the number of the QC-LDPC codes used here is three for illustration purposes, the present invention is not limited only to this number in forming the CC-QC-LDPC code. Note that the CC-QC-LDPC code 100 and the corresponding three sub-codes 111, 112, 113 are represented in FIG. 1 as, and characterized by, parity-check matrices. In each of the parity-check matrix, a column corresponds to a variable node representing one codeword bit, and a row corresponds to a check node representing a parity-check equation. A presence of "1" in an entry of a parity-check matrix means that the codeword bit in the corresponding variable node is involved in the parity-check equation of the corresponding check node. From FIG. 1, it is apparent that the number of variable nodes in the CC-QC-LDPC code 100 (namely, the code length of this code) is greater than the code length of each of the three sub-codes 111, 112, 113, but is less than the sum of the code lengths of all the sub-codes 111, 112, 113 because of overlapping some variable nodes between consecutive sub-codes. The presence of overlapping is a result of cyclic coupling in the construction of the CC-QC-LDPC code 100. In the construction of the code 100 from the three sub-codes 111, 112, 113, basically, two variable nodes from two consecutive sub-codes are combined into one variable node of the CC-QC-LDPC code 100 (by overlapping of some variable nodes between the two consecutive sub-codes) while keeping the connections to the check nodes of both neighboring sub-codes (to thereby provide coupling between the neighboring sub-codes).

Generalizing the aforementioned construction process, one obtains a CC-QC-LDPC code characterized by a parity-check matrix, H, having the following general form:

$$H = \begin{bmatrix} H_l^1 & H_m^1 & H_r^1 & 0 & 0 & \ldots & 0 & 0 \\ 0 & 0 & H_l^2 & H_m^2 & H_r^2 & \ldots & 0 & 0 \\ 0 & 0 & 0 & 0 & H_l^3 & \ldots & 0 & 0 \\ \vdots & \vdots & \vdots & \vdots & \vdots & \ddots & \vdots & \vdots \\ 0 & 0 & 0 & 0 & 0 & \ldots & H_r^{K-1} & 0 \\ H_r^K & 0 & 0 & 0 & 0 & \ldots & H_l^K & H_m^K \end{bmatrix}, \quad (1)$$

which includes K QC-LDPC sub-codes that horizontally divide H. In general, K is at least two. For $i \in \{1, \ldots, K\}$, $H_l^i$, $H_m^i$ and $H_r^i$ are non-zero submatrices, and $$H_s^i = [H_l^i \; H_m^i \; H_r^i] \quad (2)$$

is a parity-check matrix of the ith sub-code. Note that $H_s^i$ is decomposable into a left part ($H_l^i$), a middle part ($H_m^i$) and a right part ($H_r^i$) The K sub-codes may be distinct but is required to have the same size in their parity-check matrices, or may be identical for expository convenience.

The CC-QC-LDPC code as disclosed herein is different from an LDPCCC in that the two codes have different parity-check matrices. The LDPCCC has a parity-check matrix in a form similar to the one shown in (1) but with $H_r^K$ a zero matrix (see COSTELLO, D. J. Jr., et al.). On the other hand, H of the CC-QC-LDPC code has a non-zero $H_r^K$.

From (1), it is apparent that the CC-QC-LDPC code is formed by cyclically coupling the K QC-LDPC sub-codes. The ith sub-code is coupled to the (i−1)th sub-code, $2 \le i \le K$, by having $H_l^i$ and $H_r^{i-1}$ positioned in H under the same set of consecutive columns so as to serve the same set of variable nodes. Similarly, the first and the Kth sub-codes are coupled by positioning $H_l^1$ and $H_r^K$ under the same set of consecutive columns in H.

In one embodiment, each one of the $H_s^i$, i=1, . . . , K, is partitioned into blocks (or submatrices) of equal size. Optionally, each of these submatrices is a circulant identity matrix.

Besides, it is possible that the number of columns (i.e. the number of variable nodes) in the overlapping region between any two consecutive sub-codes is constant over all the K sub-codes. However, the present invention is not limited only to this condition. It is also possible that one overlapping region has the number of columns different from that of another overlapping region. In this case, there are at least two values of $i \in \{1, \ldots, K\}$ where $H_l^i$ and $H_r^i$ are different in the number of columns.

With the code structure of the CC-QC-LDPC code as disclosed above, the code length is effectively prolonged as compared to any one of the K sub-codes. The objective of having the prolonged code length is to achieve a much higher decoding capability without introducing a lot of redundant complexity to the decoder because the check-node degree of the CC-QC-LDPC code remains the same as that of each sub-code.

B. Decoder Architecture

A decoding algorithm for the CC-QC-LDPC code is derived based on BP and row-wise layered decoding.

To develop a decoder that exhibits parallelism in decoding the disclosed CC-QC-LDPC code, it is considered that each of the K sub-codes has the parity-check matrix having J block rows and L block columns, and each block (called a submatrix) is of size z×z where z is a positive integer. Besides, the overlapping region between two consecutive sub-codes covers W block columns. For $1 \le i \le K$, it follows that $H_s^i$ is of size Jz×Lz, and both $H_l^i$ and $H_r^i$ are of size Jz×Wz.

Figure 2:
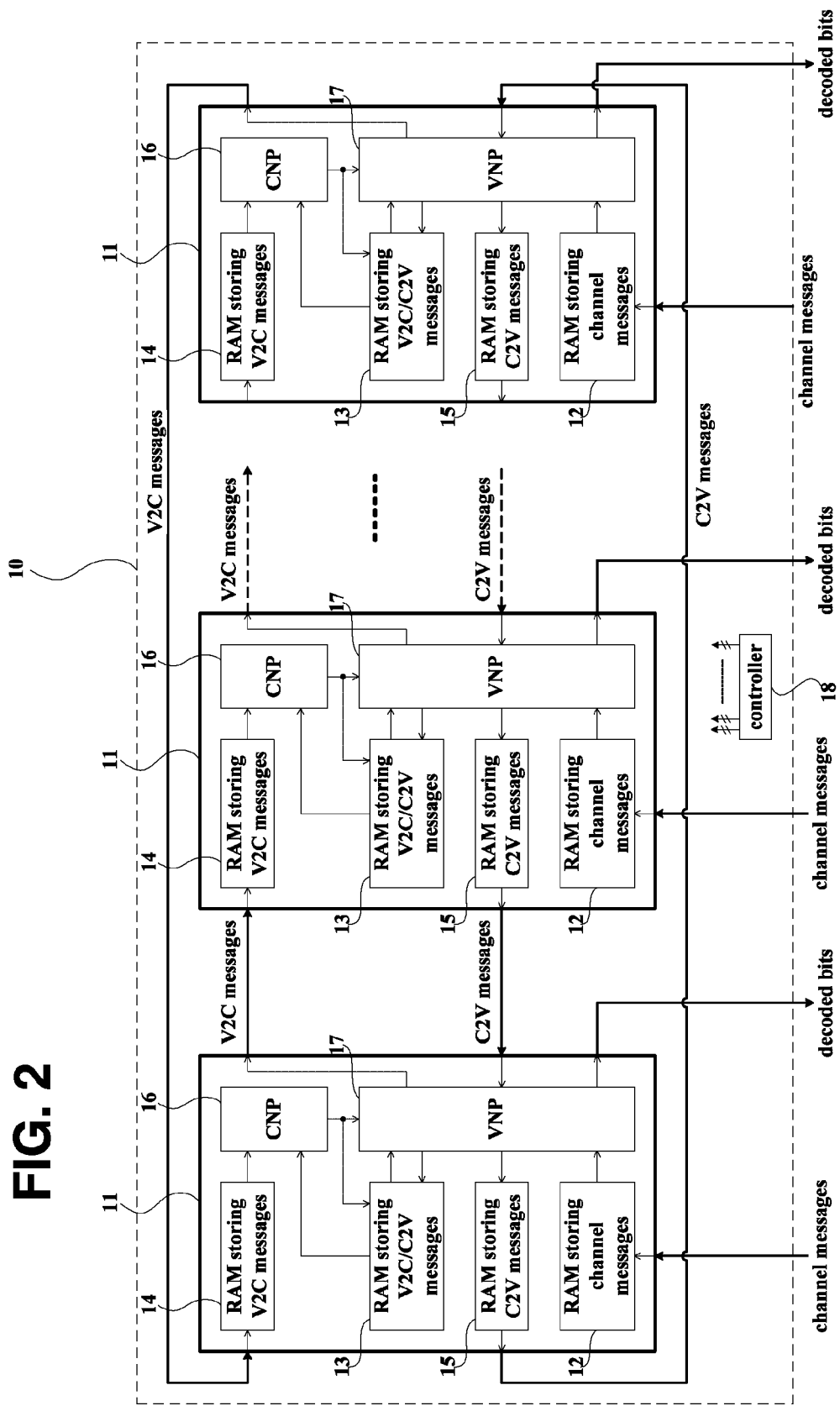
FIG. 2 is a block diagram of a CC-QC-LDPC decoder architecture according to an exemplary embodiment of the present invention.

FIG. 2 is a block diagram of a decoder 10 for decoding the CC-QC-LDPC code in accordance with an exemplary embodiment of the present invention. The decoder 10 comprises a plurality of individual sub-decoders 11. Note that the individual sub-decoders 11 are arranged in a ring shape such that an individual sub-decoder 11 communicates edge messages with two neighboring sub-decoders. Since channel messages received for each sub-code are equally weighted, an individual sub-decoder 11 for decoding the channel messages for one sub-code is configured to concurrently manage similar decoding processes. A BP algorithm updates messages passed among the check nodes and the variable nodes iteratively. For a check node m that receives V2C messages, the updated C2V messages are computed by $$\alpha_{mn} = 2\tanh^{-1}\left(\prod_{n' \in N(m) \backslash n} \tanh\left(\frac{\beta_{mn'}}{2}\right)\right) \quad (3)$$

where: $\alpha_{mn}$ denotes the updated C2V message from the check node m to the variable node n; $\beta_{mn}$ denotes an incoming V2C message from the variable node n to the check node m; and N(m) denotes the set of variable nodes connected to the check node m. After receiving $\alpha_{mn}$, the V2C message at the variable node n is then updated by $$\beta_{mn} = \lambda_n + \sum_{m' \in M(n) \backslash m} \alpha_{m'n}, \quad (4)$$

where M(n) denotes the set of check nodes connected to the variable node n, and $\lambda_n$ denotes the channel message for the variable node n. After a preset number of iterations are executed for iteratively computing (3) and (4), the APP $\beta_n$ for the variable node n is determined by $$\beta_n = \lambda_n + \sum_{m \in M(n)} \alpha_{mn}. \quad (5)$$

Based on the obtained APP, a decision is made in order to determine whether the variable node n is a bit "0" or "1".

The decoder 10 is elaborated as follows. The decoder 10 comprises K sub-decoders 11 each for decoding one sub-code, and preferably includes a global controller 18 for address and multiplexing control. Each sub-decoder 11 includes a CNP 16, a VNP 17, and a plurality of RAM blocks 30 (shown in FIG. 3). Differentiated by their purposes, the RAM blocks 31 are categorized into four types: RAM storing channel messages 12; RAM dynamically storing V2C and C2V messages 13; RAM storing V2C messages 14; and RAM storing C2V messages 15.

Utilizing an inherent parallel nature of the disclosed CC-QC-LDPC code, the decoder 10 employs a concurrent decoding process. Each sub-decoder 11 is loaded with an exclusive portion of the channel messages corresponding to one sub-code of the larger CC-QC-LDPC code. The channel messages obtained by the sub-decoder 11 are first converted to a LLR form as specified by the BP algorithm. Then processes of iterative decoding are simultaneously executed in all the individual sub-decoders 11. Advantageously, row-wise layered decoding is preferably used. With row-wise layered decoding, a full iteration updates all the check nodes once. Based on the structure of a QC-LDPC sub-code 20 (shown in FIG. 3), the check nodes thereof are updated layer by layer, each layer corresponding to one block row of the QC-LDPC sub-code 20, and architecturally the decoding of each layer is termed as a decoding state.

A full state of the decoding comprises a two-phase process in which the CNP and the VNP of each sub-decoder 11 update the C2V and V2C messages successively according to (3) and (4), respectively. The updated messages and the channel messages are stored in the corresponding RAMs 12-15 and to be used in the next state. Each sub-decoder 11 also adopts a parallel-decoding approach at the check-node level. For each layer, z check nodes are divided into G groups and each group is configured to take up one decoding stage. Subsequently, the processors and the memory are accordingly arranged.

Connections between the processors 16, 17 and the plurality of RAM blocks 30, and connections between address counters and RAM blocks 30 are switched by multiplexers and controlled by the controller 18 as specified by the parity-check matrix of the sub-code considered. At the end of each state, the selections of the multiplexers change. The address controller mainly comprises counters that are incremented by one after every decoding stage. As a result, entries of each RAM block 31 (shown in FIG. 3) are successively and cyclically accessed in each decoding state with varying initial addresses.

Figure 3:
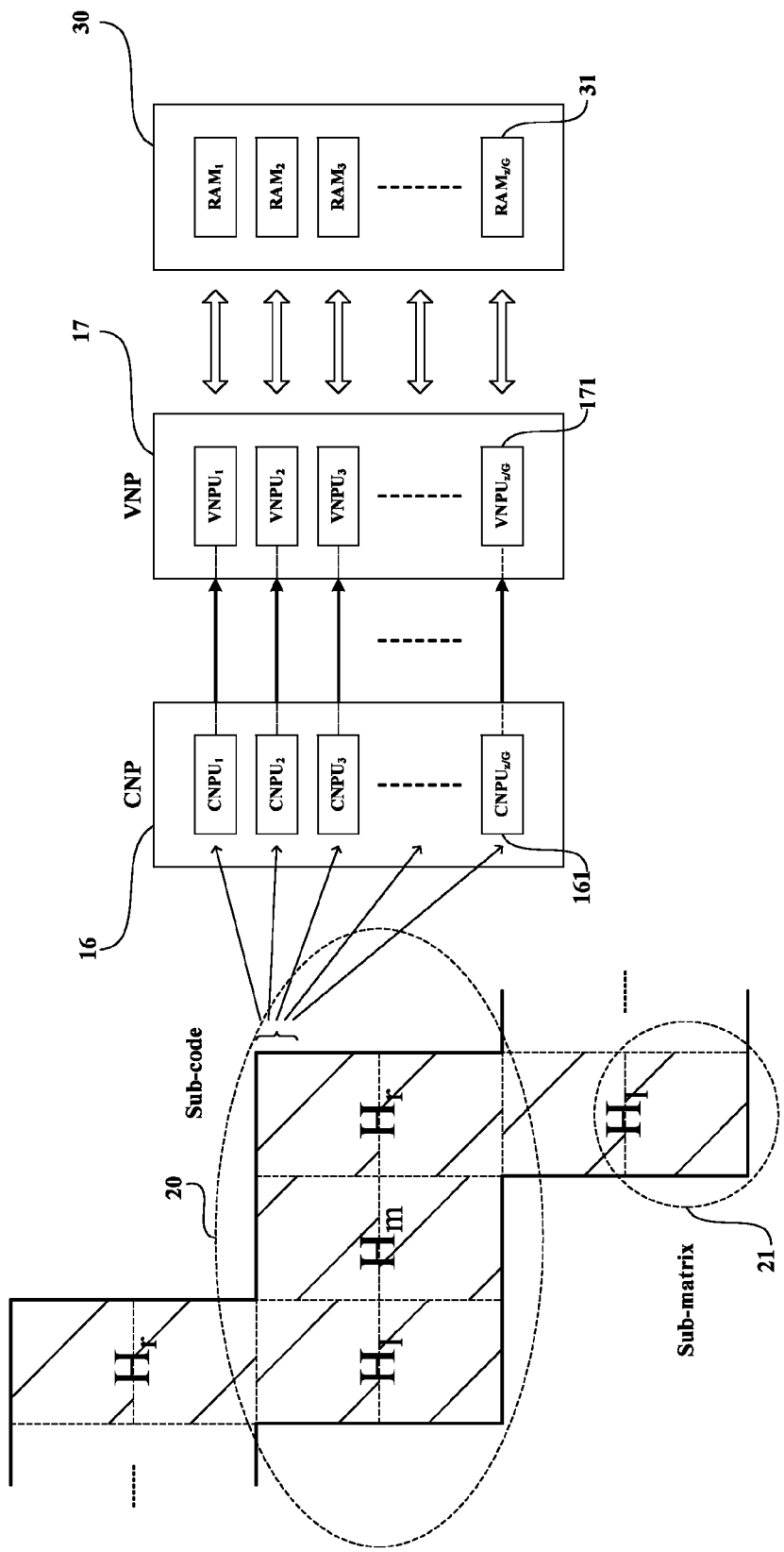
FIG. 3 is a block diagram of one sub-decoder with parallel decoding for the decoder of FIG. 2.
Figure 4:
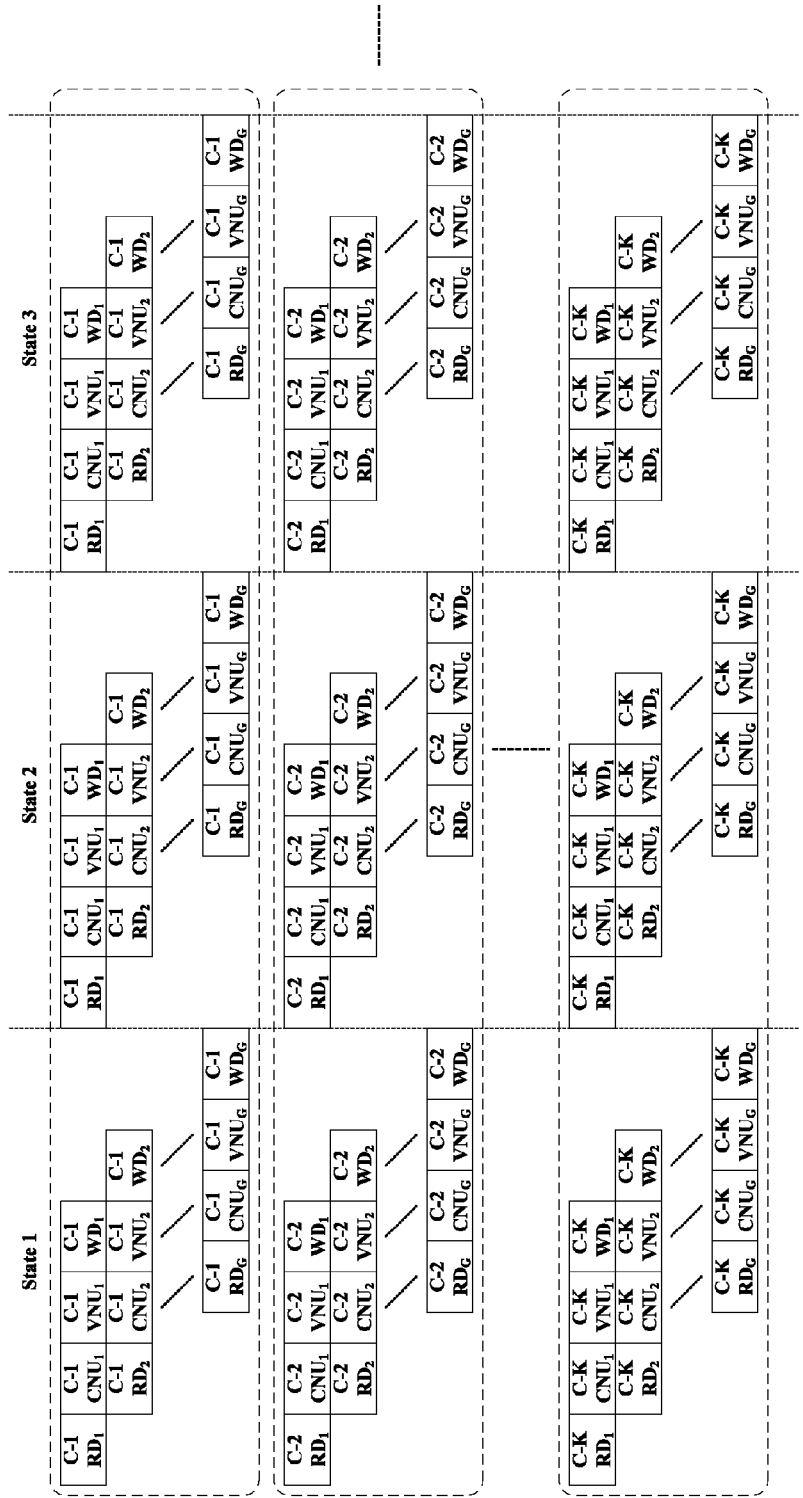
FIG. 4 is a flowchart exemplarily showing the decoding schedule.

As mentioned above, the sub-decoder 11 employs parallel decoding. Refer to FIG. 3. The CNP 16 has z/G CNPUs 161 and the VNP 17 has z/G VNPUs 171. Each CNPU-VNPU pair processes one check node and its associated variable nodes advantageously under a dispersive organization of the RAM block 31. In the sub-decoder 11, signals may all be stored in registers for pipelined processing with short delay. It follows that one entire decoding stage includes four steps: reading data from RAMs (RD); check-node updating (CNU); variable-node updating (VNU); writing data to RAMs (WD). The decoding schedule of the decoder 10 in terms of the sub-decoders 11 is exemplarily illustrated in FIG. 4. The architectural throughput of the decoding is (L−W)Kzf/J (G+4)I, where I is the number of iterations and f is the operation clock frequency. The 4-cycle latency may vary depending on other pipelining configurations.

The architecture of each CNPU 161 is described as follows. The CNPU 161 adopts a processing method based on LUTs. To reduce the complexity of the overall CNPU 161, the check-node updating process for computing (3) is decomposed into several steps. Each step considers two inputs, $I_i$ and $I_j$, to produce one output $O(I_i, I_j)$ by using simple LUTs to compute $$O(I_i, I_j) = Q\left\{2\tanh^{-1}\left(\tanh\left(\frac{I_i}{2}\right) \times \tanh\left(\frac{I_j}{2}\right)\right)\right\}, \quad (6)$$

where Q denotes quantization. Then the check node updating is accomplished by recursively using such LUTs.

Figure 5:
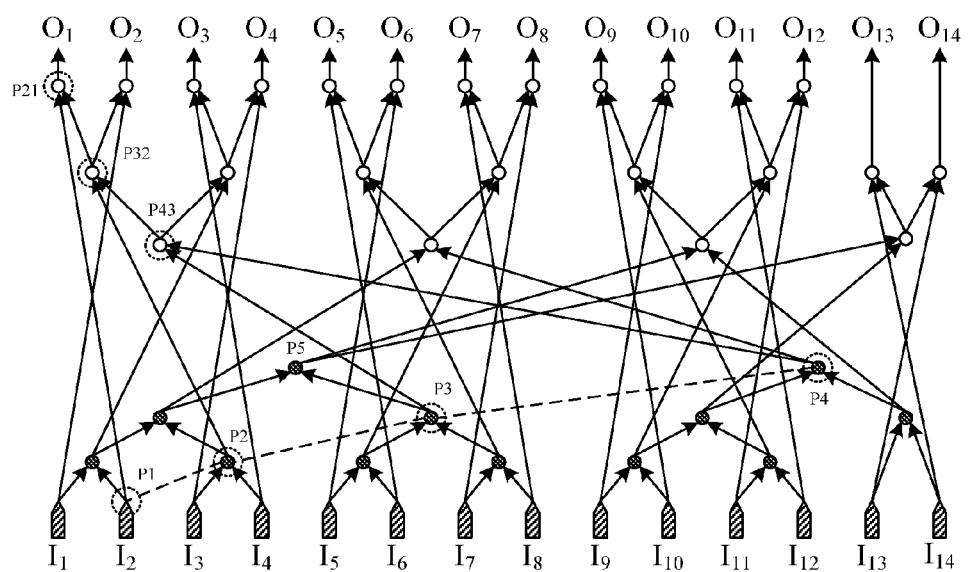
FIG. 5 is a topological graph illustrating the structure of a CNPU example with 14 inputs ($d_c$=14)

For a least usage of the LUTs and a minimal architectural delay, the LUTs are arranged to have parallel routing. This arrangement is distinct from methods and arrangements used in the prior art. Suppose that the check node m is connected to $d_c$ variable nodes. The CNPU 161 is configured to feedback each variable node $n_i$ ($1 \leq i \leq d_c$) with the C2V message updated by multiplying (in the hyperbolic tangent domain) the V2C messages from all the other variable nodes. The design as disclosed herein arranges these multiplicative operations based on dividing all the variable nodes into hierarchical groups: at the top level, the variable nodes are divided into two groups; at the second level, both groups are further divided into two sub-groups to form four groups in total, etc. At the bottom level, there are $d_c$ groups each containing only one variable node. To compute the C2V message towards variable node $n_i$, the V2C products of all the groups excluding $n_i$ in all hierarchies are required. Moreover, each group can have its V2C product shared in order to generate the C2V messages towards variable nodes of the other group in the same hierarchy. The details of the design concept can be described by an illustrative example with $d_c=14$. A topological graph of the CNPU 161 is shown in FIG. 5, where the nodes represent the LUTs and the arrows reflect the connections and dataflow directions among these LUTs. The process can be completed by the following two steps.

1) Forward Step: Place $d_c-2$ LUTs in parallel to form a binary tree (solid nodes in FIG. 5) with the root disregarded. Leaves of the tree are the V2C inputs. This tree is required to be a balanced tree so that it has a minimum possible height, and hence the delay of the critical path is minimized. Accordingly, the above-mentioned grouping scheme is graphically exhibited in FIG. 5.

2) Backward Step: Connect each parent node to the children of its sibling node (for example, refer to dashed lines in FIG. 5). Then $d_c$ paths are formed, each leading downward to one input. The segments (connections) of each path can be implemented with cascaded LUTs (hollow nodes shown in FIG. 5), each of which represents the product combination of two correspondingly connected groups at consecutive levels. For example, P4 is connected to P3 whose parent node P5 is a sibling of P4 and this connection designates P43 to output the product of $I_5 \sim I_{14}$. Similarly and continuously, P32 and P21 are implemented for the P3-P2 and P2-P1 connections, respectively. As is conspicuously shown, the output $O_1$ of P21 is the final resultant C2V message for $n_1$.

The VNPU 171 for computing (4) basically comprises adders. As arranged, edge messages corresponding to the middle ($H_m^i$) and the right ($H_r^i$) parts of $H_s^i$ are processed by a current sub-decoder 11, and edge messages corresponding to the left part ($H_l^i$) are processed by a previous sub-decoder 11. However, the VNPU 171 is not limited only to this arrangement; the VNPU 171 may be alternatively arranged such that the current sub-decoder 11 processes the edge messages corresponding to $H_m^i$ and $H_l^i$ while the previous sub-decoder 11 processes those corresponding to $H_r^i$. Comparatively, the variable nodes of the right part, connecting also to the check nodes of the next sub-code 20, require more adders than the middle part does.

Distinct from other LDPC decoders, the VNP 17 updates not only the V2C messages within each sub-decoder 11 but also the V2C messages of the overlapping region. It is arranged, as an example, that the variable-node updating in the overlapping region is performed by the preceding sub-decoder 11. Therefore, the VNPU 171 for each of these variable nodes uses two adders, the first one to produce the edge messages from the variable node to the check node of the preceding sub-code 20, and the second one to produce the edge messages from the same variable node to the check node of the following sub-code 20. The C2V messages produced by the CNP 16 of both sub-decoders 11 are simultaneously required and added up by the VNP 17 of the preceding sub-decoder 11, calling for C2V messages ($H_l^i$) of the following sub-decoder 11 passing to the preceding sub-decoder 11. Then the updated V2C messages produced by the second adder are sent to the following sub-decoder 11 for its check-node updating to be performed by its CNP 16. Hereby, the mutual dependence of the successive sub-codes 20 in the CC-QC-LDPC code is manifested by such exchange of V2C/C2V messages between them.

Figure 6:
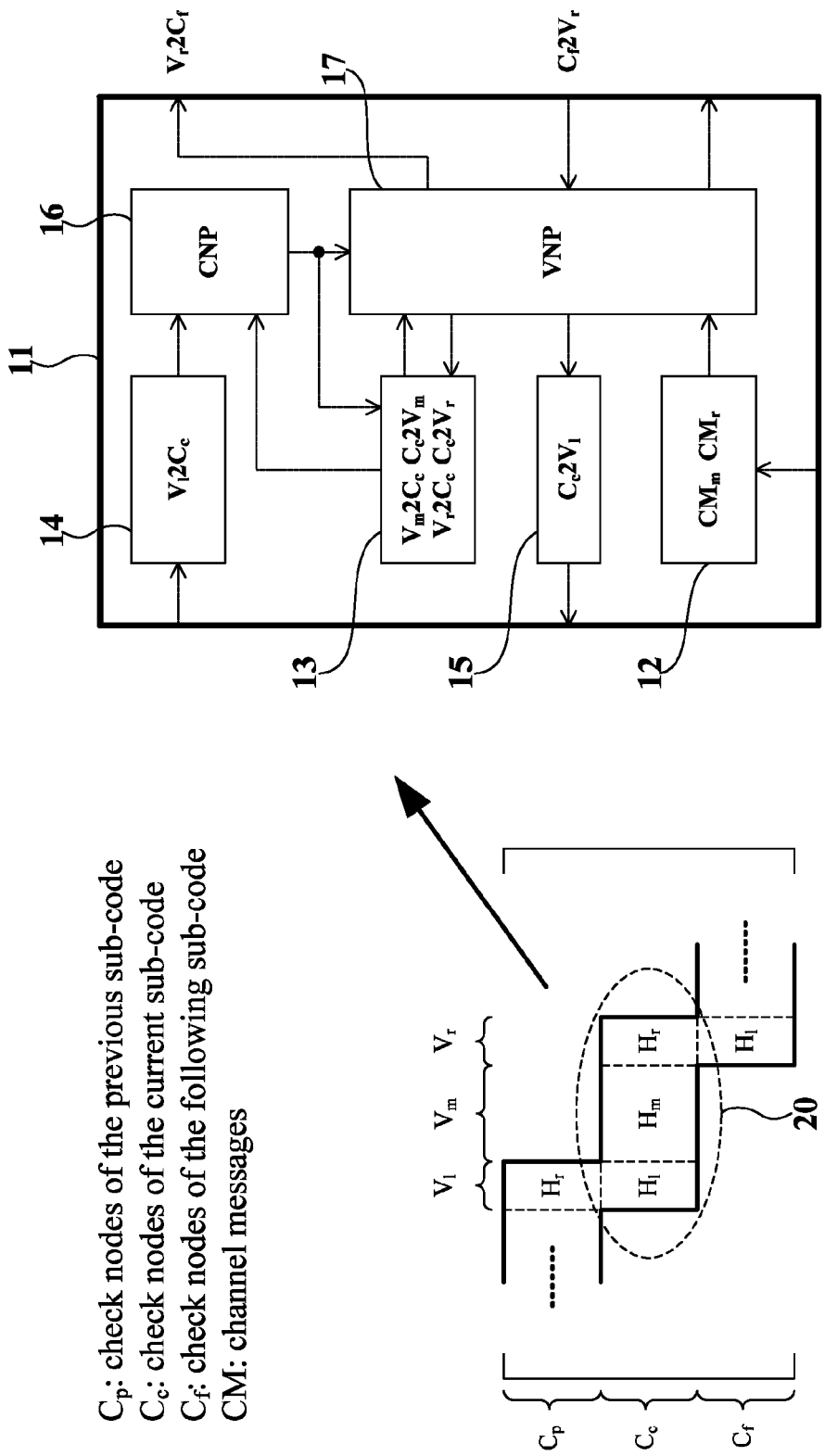
FIG. 6 is a block diagram showing the allocation of RAMs in terms of the parity-check matrix for the CNPU example of FIG. 5.

The memory storage is described as follows. Refer to FIG. 2. There are four types of RAM blocks (i.e. 12, 13, 14 and 15) that store different types of messages and hence behave differently. The coverage of the four types of RAM blocks in terms of the parity-check matrix is illustrated in FIG. 6. The RAM 12 permanently stores the channel messages of the variable nodes in the middle part $H_m$ and the right part $H_r$ of the sub-code 20. The content will be replaced by new channel messages after the current codeword has been decoded. The RAM 13 stores the edge messages corresponding to the middle part $H_m$ and the right part $H_r$ of the current sub-code 20. At each decoding state only one layer is processed, allowing the memory to only store the V2C messages of that layer and only the C2V messages of the other layers. Therefore, the message types contained in the RAM 13 are dynamically changed and the values stored therein are continuously updated.

The RAM 14 and the RAM 15 are dedicated to store the V2C and C2V messages, respectively. With message type unchanged, the content values are also continuously updated by the processors 16, 17. In the current sub-decoder 11, the messages read from the RAM 14 are generated by the previous sub-decoder 11 while the messages written into the RAM 15 are used by the previous sub-decoder 11.

Refer to FIG. 3. The dispersive organization of RAM blocks 31 is illustrated as follows. To support parallel processing performed in the CNP 16 and in the VNP 17, z/G RAM blocks 31 of all the four types 12-15, each for the use of one fixed CNPU 161 and/or one fixed VNPU 171, are combined into a larger RAM block 30. Such a larger RAM block 30 provides the memory corresponding to one sub-matrix 21 (or one block column when dealing with channel messages). According to the decoding schedule, the G entries of each RAM block 31, successively accessed in each decoding state, are configured to serve G check nodes of each layer that are separated by z/G. If the first entry is concerned with the ith check node $C_i$ ($1 \leq i \leq z/G$) of one layer, then the subsequent entries are concerned with the check nodes $C_{i+z/G}, C_{i+2z/G}, \ldots, C_{i+(g-1)z/G}, \ldots, C_{i+(G-1)z/G}$, where g denotes the order of each group.

The memory is quantified with consideration of the parity-check matrix of each sub-code 20. For the RAM 12, which stores the channel messages corresponding to all block columns, there are L−W larger RAM blocks 30 and hence (L−W)z/G RAM blocks 31. With dynamic storage, the RAM 13 allocates only one location for each edge message and covers J(L−W) submatrices 21, so that J(L−W)z/G RAM blocks 31 are required for this partition. Similarly, the RAM 15, dedicated to storing C2V messages, has JWz/G RAM blocks 31.

Figure 7:
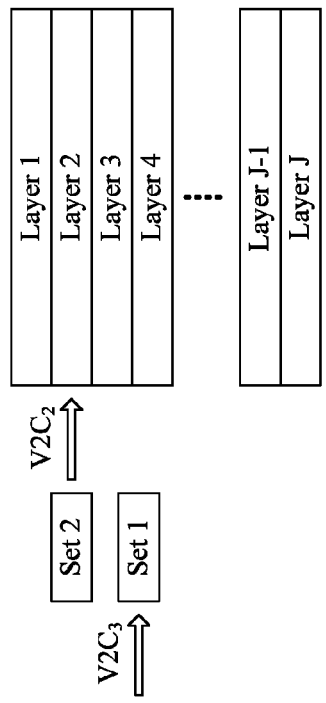
FIG. 7 is a diagram showing the working mode of RAM storing V2C messages for the CNPU example of FIG. 5.
Figure 7:
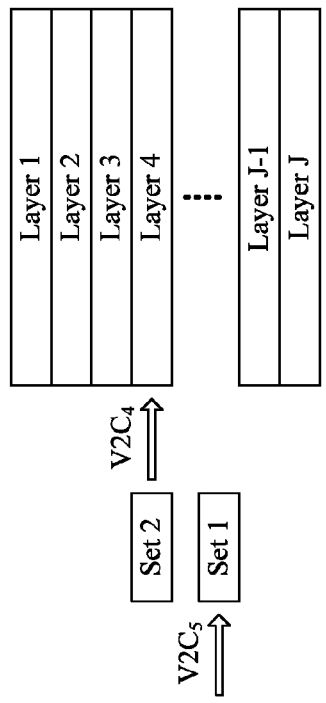
Figure 7:
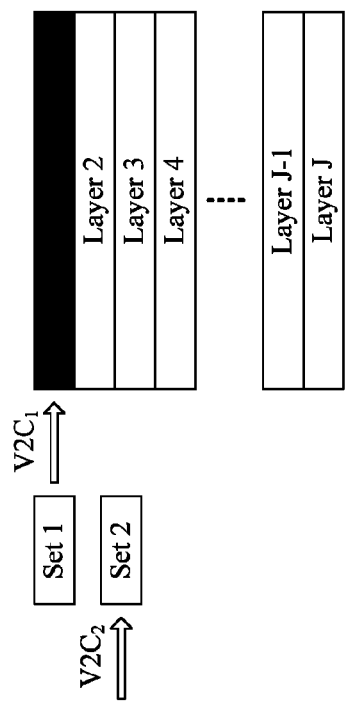
Figure 7:
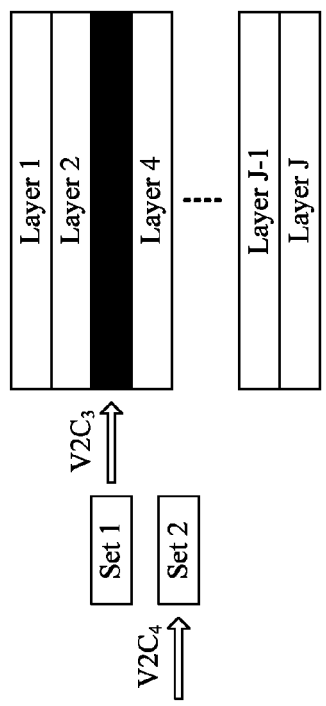

Different from the RAM 15, it is not necessary for the RAM 14 to store the full V2C messages for the left part $H_l$ of the sub-code 20 because only one layer is processed at each decoding state. Due to the difference between the reading and the writing addresses, two RAM sets of the RAM blocks 31 are alternately used to convey the messages for the odd or even layers of the sub-code 20. At each decoding state, one RAM set is read while the other is written as illustrated in FIG. 7. As a result, the RAM 14 includes 2 Wz/G RAM blocks 31.

The overall decoder 10 therefore comprises the RAM blocks 31 each of G entries. Moreover, the numbers of such RAM blocks 31 used for storing different types of messages are summarized as follows:
K(L−W)z/G RAM blocks 31 for storing channel messages;
KJ(L−W)z/G RAM blocks 31 for storing mixed V2C/C2V messages;
KJWz/G RAM blocks 31 for storing C2V messages; and
2 KWz/G RAM blocks 31 for storing V2C messages.

An example of the decoding process is provided as follows. Refer to FIG. 8A. A CC-QC-LDPC code is constructed by cyclically coupling two identical QC-LDPC sub-codes with K=2, L=4, J=2, W=1 and G=z=3. Accordingly, a total of twenty-six RAM blocks 31 are used, each having three entries. Also, two sub-decoders 11 are implemented, each for one sub-code 20. Among the twenty-six RAM blocks 31, thirteen RAM blocks 31 are included in each sub-decoder with the following division: RAM1 and RAM2 for V2C messages (the RAM 14); RAM3 and RAM4 for C2V messages (the RAM 15); RAM5 to RAM10 for V2C/C2V messages (the RAM 13); and RAM11 to RAM13 for channel messages (the RAM 12).

Figure 8B:
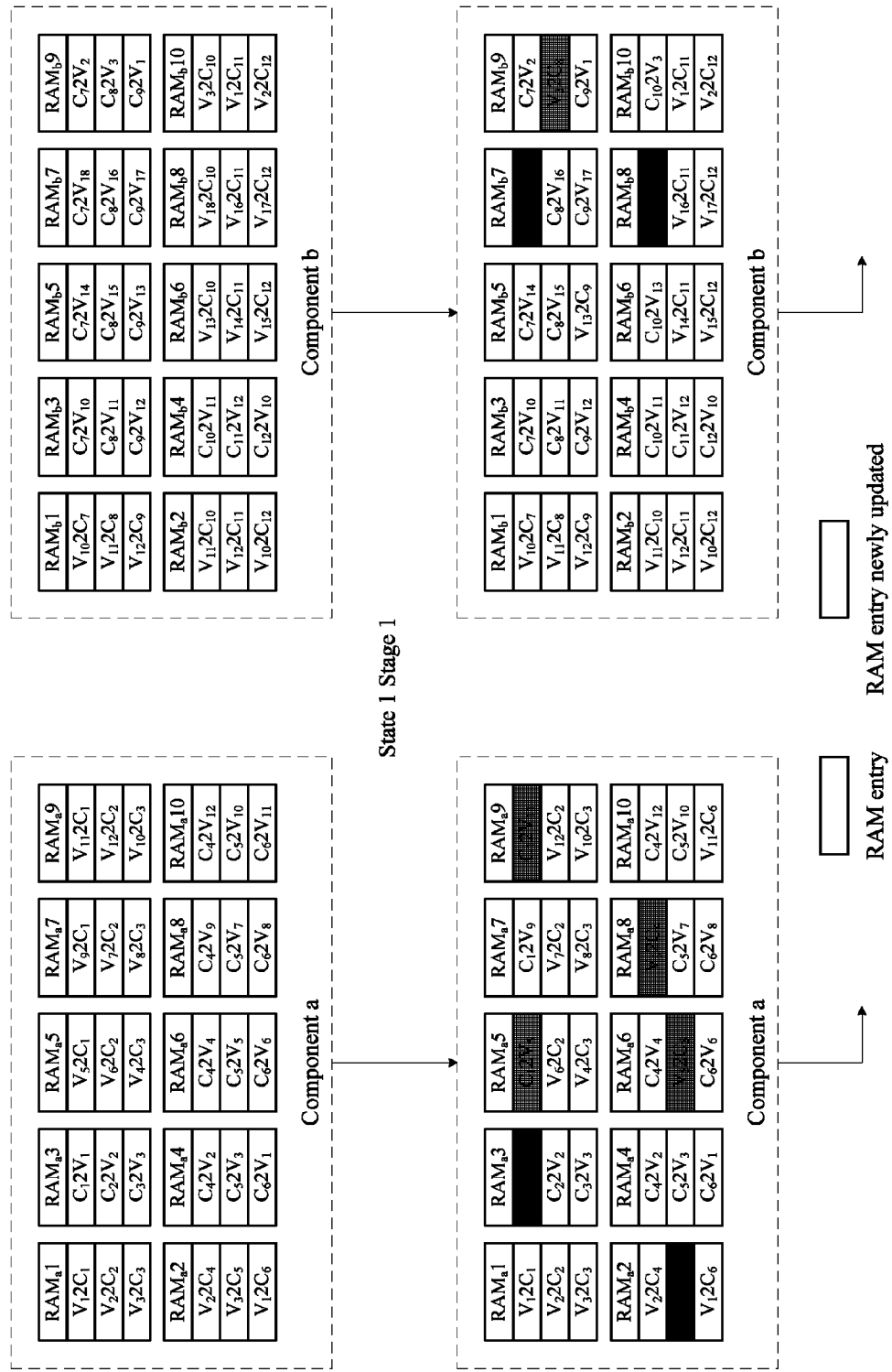
FIGS. 8B-8E are diagrams showing the storage of edge messages of the code example of FIG. 8A for one entire decoding iteration.

The decoding process of one iteration includes two decoding states each fulfilled by three decoding stages. As an example considered here, the decoding of the sub-code a starts from its first layer while the decoding of the sub-code b starts from its second layer. Refer to FIG. 8B. The initial contents of $\{RAM_a5, RAM_a7, RAM_a9\}$ and $\{RAM_b6, RAM_b8, RAM_b10\}$ are V2C messages while the initial contents of $\{RAM_a6, RAM_a8, RAM_a10\}$ and $\{RAM_b5, RAM_b7, RAM_b9\}$ are C2V messages.

At the first decoding stage, the check node C1 and C10 are updated with the associated variable nodes. For the sub-code a, $\{V_1 2C_1, V_5 2C_1, V_9 2C_1, V_{11} 2C_1\}$ are retrieved and fed to the CNP 16 to produce $\{C_1 2V_1, C_1 2V_5, C_1 2V_9, C_1 2V_{11}\}$. These newly updated C2V messages immediately substitute the V2C messages at their memory locations except $C_1 2V_1$, which is dedicatedly stored in $RAM_a3$. At the same time, $\{C_5 2V_5, C_4 2V_9, C_6 2V_{11}, C_8 2V_{11}, C_{10} 2V_{11}\}$ together with $\{CM_5, CM_9, CM_{11}\}$ are added to the newly updated C2V messages to produce $\{V_5 2C_5, V_9 2C_4, V_{11} 2C_6, V_{11} 2C_8\}$. Also, these newly updated V2C messages immediately substitute the C2V messages at their memory locations except $V_{11} 2C_8$, which is dedicatedly stored in $RAM_b1$. Note $\{C_8 2V_{11}, C_{10} 2V_{11}\}$ are retrieved from the sub-decoder b to compute $V_{11} 2C_6$ of the sub-code a, and $V_{11} 2C_8$ are generated by the sub-decoder a but used for the decoding of the sub-code b.

Figure 8C:
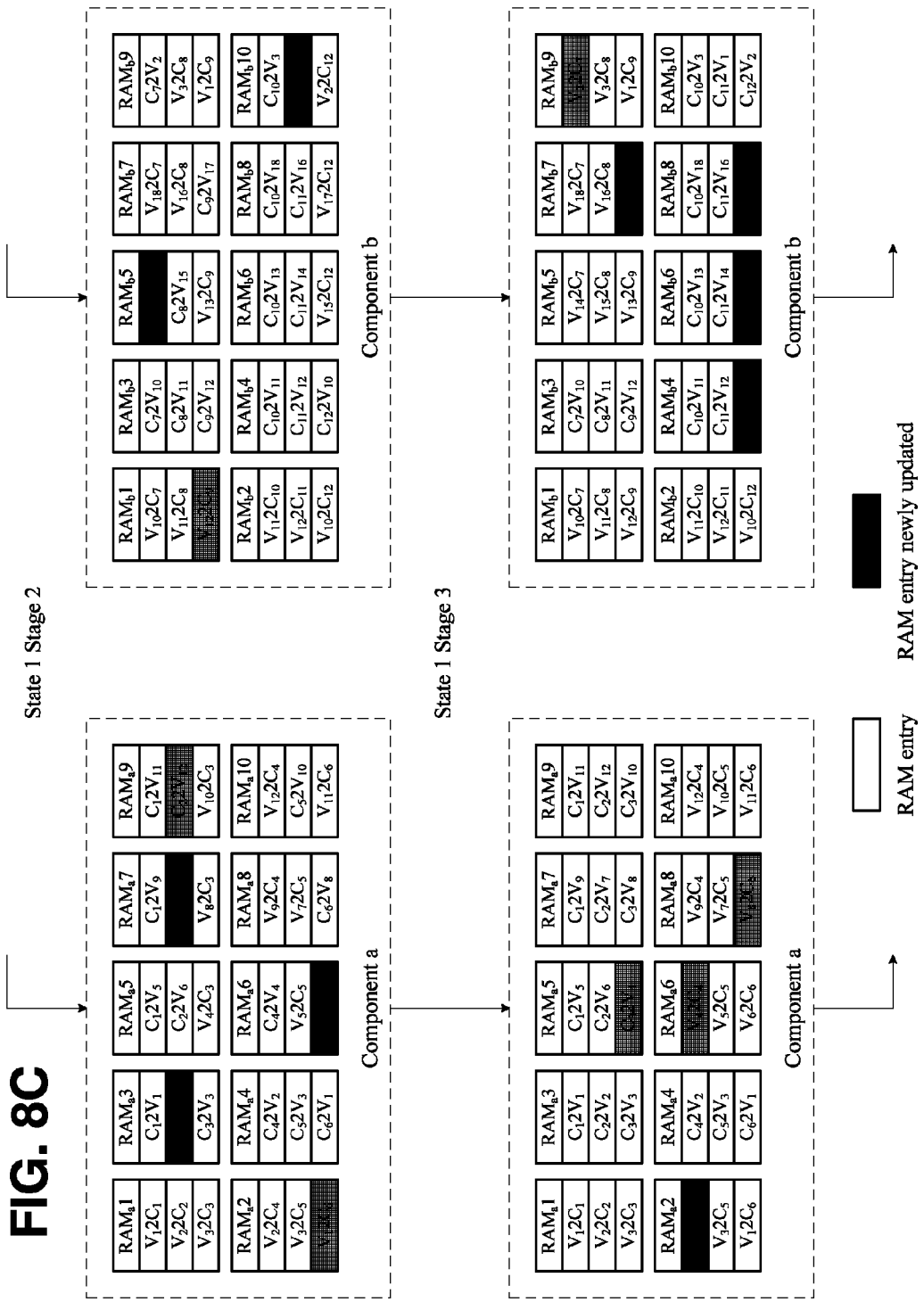

The following two stages process the subsequent check nodes of the layer in a similar way. Refer to FIG. 8C. Entries of RAMs are successively accessed and updated so that the address of each RAM is incremented by one at the end of each stage. Nevertheless, when the decoding of one layer is finished, the first stage of the next layer may be initialized with discontinuous addresses. For example, the address of $RAM_a9$ is 3 at the third stage of the first state, but is changed to 2 at the first stage of the second state. This contrast is illustrated by the bottom half of FIG. 8C and the top half of FIG. 8D.

Figure 8D:
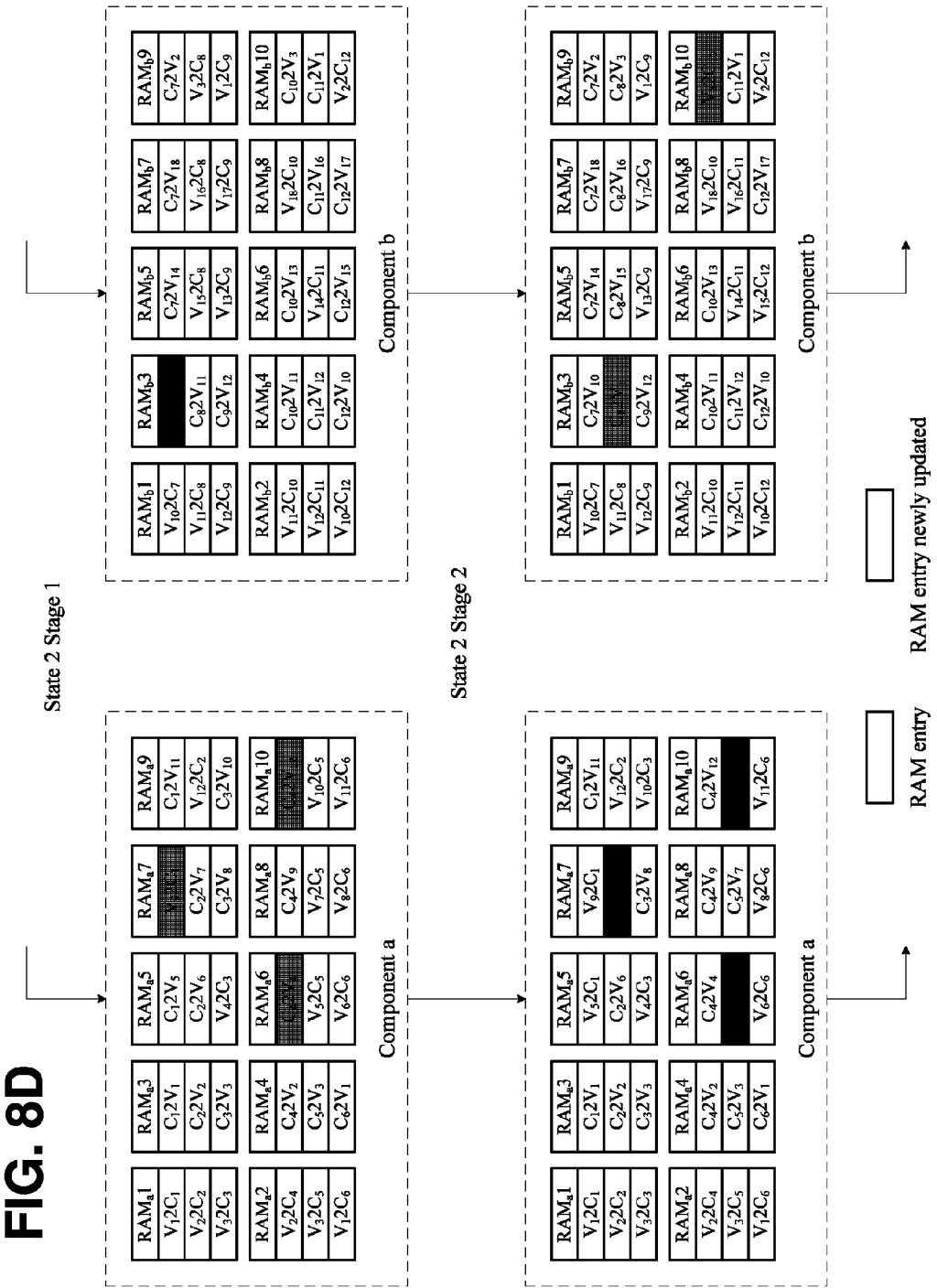
Figure 8E:
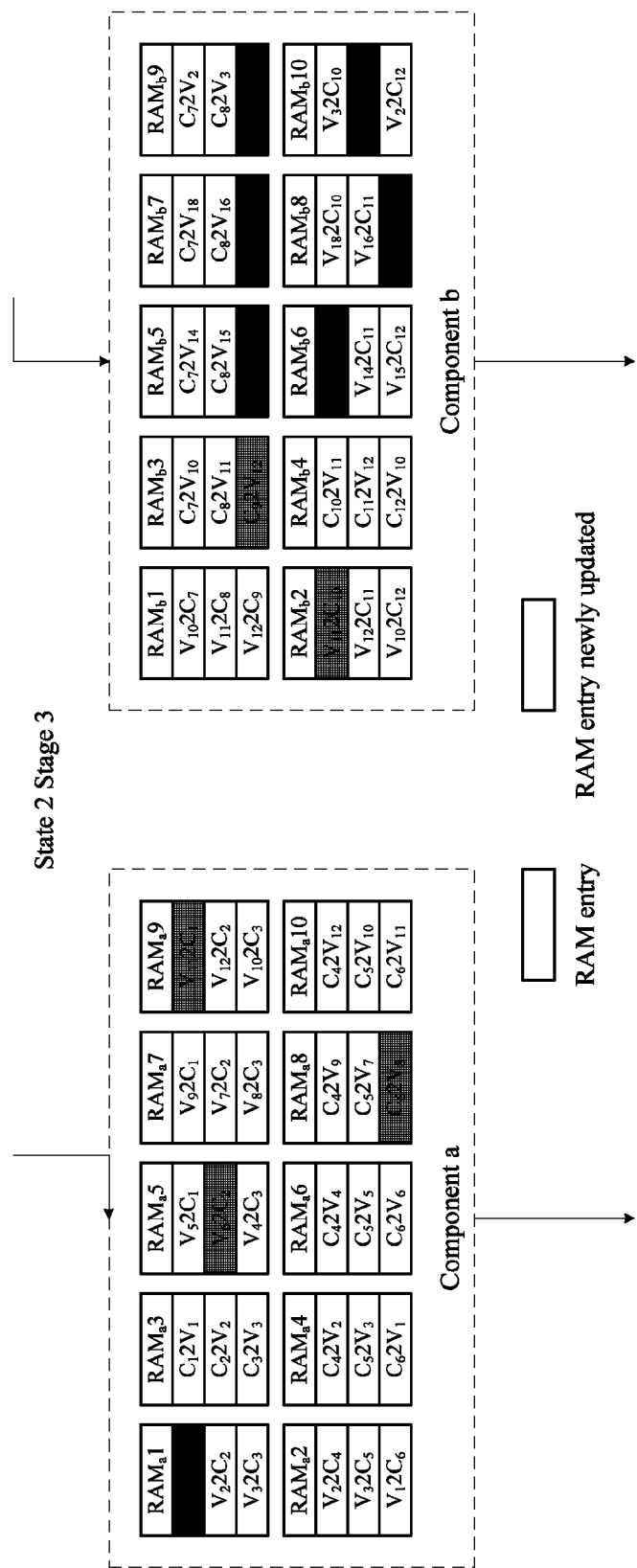

After the first state, the message type in $\{RAM_a5, RAM_a7, RAM_a9\}$ and $\{RAM_a6, RAM_a8, RAM_a10\}$ are swapped just to prepare for the decoding of the next layer. FIGS. 8D and 8E show how the messages are updated step-by-step in the second state. Refer to FIG. 8E. The memory state returns to what it is at the beginning, but the content values are all refreshed once. A full iteration of BP decoding is thereby completed. The RAMs for the sub-code b behave simultaneously and similarly with those for the sub-code a. The only difference lies in the order of the processed layers.

The controller 18 uses three counters to control the addresses of RAMs. Initialized with mutually distinct numbers, these counters are incremented by one after each clock to provide a complete set of possible addresses.

Figure 8F:
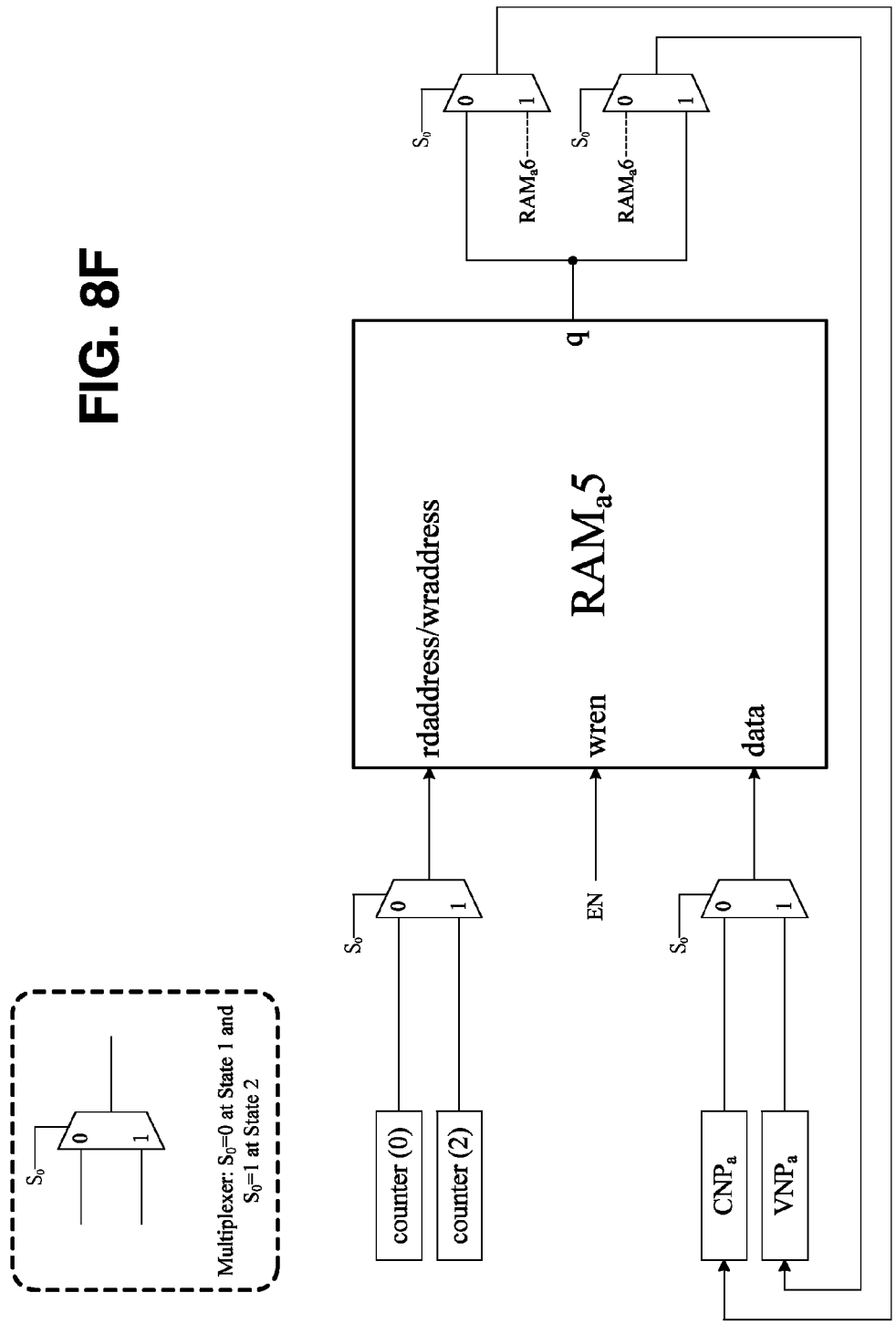
FIG. 8F is a diagram of the connections concerning $RAM_a5$ of the code example of FIG. 8A.

The connections within the decoder 10 are fulfilled with 2-to-1 multiplexers controlled by a one-bit signal indicating the state. $RAM_a5$ is considered as an example shown in FIG. 8F. The connections can be found to be consistent with the decoding process.

C. An Implementation Example, and Experimental Results

Figure 9:
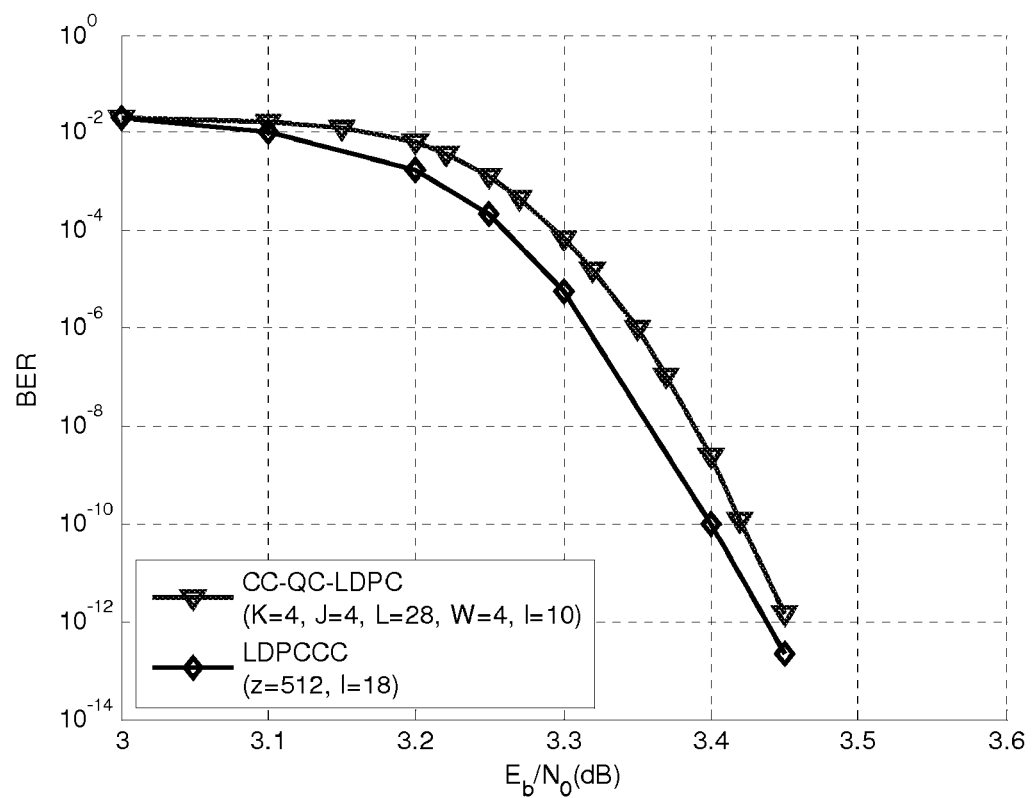
FIG. 9 is a graph plotting BERs achieved by the CC-QC-LDPC decoder and a typical LDPCCC decoder based on FPGA simulation.

As an example prototype, the CC-QC-LDPC decoder 10 was implemented onto an Altera Stratix IV FPGA. Experimental results on BER were obtained. FIG. 9 shows the error performance in terms of BER against $E_b/N_0$ for the CC-QC-LDPC code that is disclosed herein. For comparison, simulation results of a typical LDPCCC decoder were also obtained and are plotted in FIG. 9. The data of the decoders are all quantized to 4 bits for the CC-QC-LDPC code and the LDPCCC. Results shown in FIG. 9 indicate that the BER of the CC-QC-LDPC decoder with 10 iterations (I=10) is close to that of the LDPCCC decoder with 18 iterations. At a BER of $10^{-12}$, there is only 0.02 dB in SNR difference. A further long-term experiment (not shown here) has confirmed that no error floor exists above a BER of $10^{-14}$ and even no error bit is detected among the $1.14 \times 10^{16}$ decoded bits at a SNR of 3.50 dB.

The CC-QC-LDPC decoder with z=1024 employs 70324 combinational adaptive look-up tables, 43801 registers and 2359296 memory bits. The architectural complexity, especially in memory size, is much less than that of the LDPCCC decoder. With a code rate of 5/6, it was found that the CC-QC-LDPC decoder achieved an information throughput of 1.55 Gbps.

D. The Present Invention

In a first aspect of the present invention, a method for encoding a bit sequence of length k to introduce error-correcting capability to the bit sequence is provided.

The method comprises generating, by one or more processors, a codeword from the bit sequence by computing $d=G^T b$, where d is the codeword expressed as a length-n column vector, b is the bit sequence expressed as a length-k column vector, and G is a k×n generator matrix of an error-correcting block code. The error-correcting block code is the CC-QC-LDPC code as disclosed in Section A above. In addition, G is required to satisfy $HG^T=0$ where H is a (n−k)×n parity-check matrix given by (1). There are techniques in the art to enable an ordinary skilled person to determine G from H, e.g., techniques detailed in William RYAN and Shu LIN, Channel Codes: Classical and Modern, Cambridge University Press, 2009, the disclosure of which is incorporated by reference herein in its entirety. Other features of H, as can be adopted in embodiments of the present invention, are elaborated in Section A above.

Optionally, the method further comprises puncturing the codeword to generate a shortened codeword. Puncturing may be required in some practical applications of the disclosed CC-QC-LDPC code in order to satisfy certain operational requirements such as the requirement to support a given information-data rate for a communication system.

In a second aspect of the present invention, a digital-communication method for transmitting a bit sequence of length k from a sender to a receiver over a channel is provided. In particular, the bit sequence is encoded with the disclosed CC-QC-LDPC code before transmission in order to protect the bit sequence from possible corruption by channel noise or interference.

Each of the sender and the receiver is an electronic device comprising a communication apparatus for supporting digital communications, and one or more processors for doing computing. The channel can be, but is not limited to, a communication channel or a storage channel. The communication channel is used to transmit data from the sender to the receiver. Examples of the communication channel include a wireless radio channel, a wired channel and an optical channel. The storage channel refers to storing data in a recording medium, e.g., an optical disk. By encoding the bit sequence with the CC-QC-LDPC code, errors introduced to the bit sequence due to, e.g., scratching on the optical disk, are possible to be removed.

Figure 10:
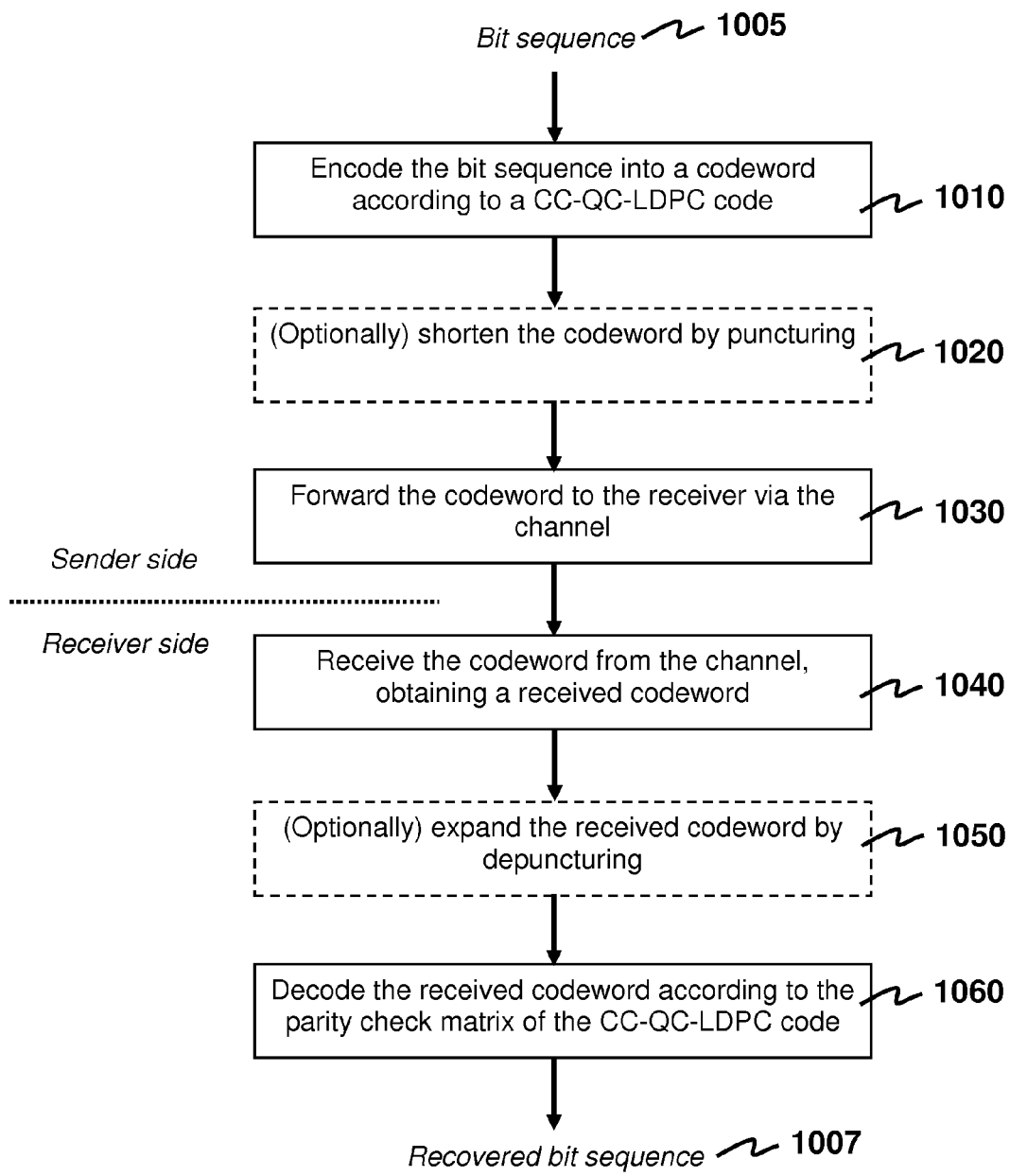
FIG. 10 is a flowchart depicting, in accordance with one embodiment of the present invention, a digital-communication method of transmitting a bit sequence over a channel where the bit sequence is protected by encoding it with the CC-QC-LDPC code as disclosed herein.

FIG. 10 is a flowchart showing a process flow of the disclosed digital-communication method according to one embodiment of the present invention.

In the method, the one or more processors of the sender encodes the bit sequence of length k 1005 to introduce error-correcting capability thereto by generating a codeword of length n from the bit sequence as set forth in any embodiment above according to the first aspect of the present invention (step 1010). Optionally, the codeword is punctured to yield a shortened codeword of length less than n (step 1020). That is, the codeword originally of length n is shortened to a length of less than n by puncturing the length-n codeword at one or more selected bit positions. The sender then forwards the codeword to the receiver via the channel (step 1030). In the step 1030, the sender first prepares the codeword in a suitable format for transmission over the channel by applying additional processing on the codeword, and thereafter transmits the codeword over the channel. Examples of such additional processing include applying further channel coding, interleaving, packetizing and modulation.

The receiver receives the codeword from the channel (step 1040), and obtains a received codeword that is a copy of the codeword possibly corrupted with channel noise. It is obvious to an ordinary skilled person in the art that some processing steps are involved in obtaining the received codeword from the channel. For example, an analog output of the channel is filtered and demodulated to produce a digital data sequence, which is then de-interleaved if interleaving was used at the sender. If puncturing was used at the sender, the received codeword originally of length less than n is expanded to a length of n by depuncturing (step 1050). Finally, the one or more processors of the receiver decode the received codeword according to the parity-check matrix of the CC-QC-LDPC code used by the sender in encoding the bit sequence 1005 (step 1060) so as to obtain a recovered bit sequence 1007.

A third aspect of the present invention is to provide a decoder for decoding received channel messages of codeword bits. The codeword bits are encoded by the disclosed CC-QC-LDPC code as elaborated above. As mentioned above, the CC-QC-LDPC code is formed by plural sub-codes, each being a QC-LDPC code, with overlapping of some variable nodes between two consecutive sub-codes. The decoder is as set forth in Section B above.

The decoder comprises a plurality of sub-decoders. The number of the sub-decoders is the same as the number of the sub-codes. Each sub-decoder is configured to decode the channel messages for one sub-code. The sub-decoders are arranged in a ring shape such that an individual sub-decoder is configured to communicate edge messages with two neighboring sub-decoders adjacent said individual sub-decoder in the decoding of the channel messages. Furthermore, the sub-decoders are configured to operate concurrently for simultaneously decoding individual sub-codes.

Preferably, each sub-decoder comprises a plurality of layered decoders each configured to receive the channel messages and the edge messages, and to update the edge messages and make final decisions. Each layered decoder comprises CNPs for updating C2V messages, VNPs for updating V2C messages, and a plurality of RAM blocks for storing messages corresponding to variable nodes associated with said one sub-code for which said each sub-decoder is configured to decode the channel messages. The C2V messages and the V2C messages are updated iteratively, thereby enabling each layered decoder to perform iterative decoding. The iterative decoding may be performed by executing a preset number of iterations in updating the C2V messages and the V2C messages.

It is also preferable that each sub-decoder further comprises a global controller. The global controller comprises an address controller for performing memory address management fulfilled by counters, and a multiplexing controller for switching connections between the layered decoders and the RAM blocks, and connections between the counters and the RAM blocks.

Other embodiments of the decoder are apparent by reference to Section B above.

In the embodiments disclosed herein, the CNP, VNP, CNPU, VNPU, any sub-decoder and the decoder may be implemented using general purpose or specialized computing devices, computer processors, or electronic circuitries including but not limited to DSP, ASIC, FPGA, and other programmable logic devices configured or programmed according to the teachings of the present disclosure. In addition, the sub-decoder or the decoder may be implemented using one or more discrete processors or may be realized as one integrated circuit. Computer instructions or software codes running in the general purpose or specialized computing devices, computer processors, or programmable logic devices can readily be prepared by practitioners skilled in the software or electronic art based on the teachings of the present disclosure.

The present invention may be embodied in other specific forms without departing from the spirit or essential characteristics thereof. The present embodiment is therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A decoder for decoding received channel messages of codeword bits, the codeword bits being encoded by a cyclically-coupled quasi-cyclic low-density parity-check (CC-QC-LDPC) code, the CC-QC-LDPC code being formed by plural sub-codes, each being a quasi-cyclic low-density parity-check (QC-LDPC) code, with overlapping of variable nodes between two consecutive sub-codes, the decoder comprising:
   a plurality of sub-decoders, wherein:
      (a) the number of the sub-decoders is the same as the number of the sub-codes;
      (b) each sub-decoder is configured to decode the channel messages for one sub-code;
      (c) the sub-decoders are arranged in a ring shape such that an individual sub-decoder is configured to communicate edge messages with two neighboring sub-decoders adjacent said individual sub-decoder in the decoding of the channel messages;
      (d) each sub-decoder comprises:
         a plurality of layered decoders each configured to receive the channel messages and the edge messages, and to update the edge messages and make final decisions, wherein each layered decoder comprises check node processors (CNPs) for updating check-to-variable (C2V) messages, and variable node processors (VNPs) for updating variable-to-check (V2C) messages, and wherein the C2V messages and the V2C messages are updated iteratively, thereby enabling each layered decoder to perform iterative decoding; and a plurality of random access memory (RAM) blocks for storing messages corresponding to variable nodes associated with said one sub-code for which said each sub-decoder is configured to decode the channel messages; and (e) the sub-decoders are configured to operate concurrently such that processes of iterative decoding are simultaneously executed in all the sub-decoders.

2. The decoder of claim 1, further comprising a global controller, the global controller comprising:

an address controller for performing memory address management fulfilled by counters; and a multiplexing controller for switching connections between the layered decoders and the RAM blocks, and connections between the counters and the RAM blocks.

3. The decoder of claim 1, wherein the iterative decoding is performed by executing a preset number of iterations in updating the C2V messages and the V2C messages.

4. The decoder of claim 1, wherein a first portion of the RAM blocks stores V2C messages corresponding to variable nodes co-owned by two adjacent sub-codes, and wherein the two sub-decoders each for decoding one of said two adjacent sub-codes are configured such that each of the RAM blocks in the first portion is read and written respectively by said two sub-decoders.

5. The decoder of claim 1, wherein a second portion of the RAM blocks stores C2V messages corresponding to the variable nodes co-owned by two adjacent sub-codes, and wherein the two sub-decoders each for decoding one of said two adjacent sub-codes are configured such that each of the RAM blocks in the second portion is read and written respectively by said two sub-decoders.

6. The decoder of claim 1, wherein a third portion of the RAM blocks stores edge messages corresponding to variable nodes of said one sub-code, and wherein said each sub-decoder is configured to read and write each of the RAM blocks in the third portion.

7. The decoder of claim 1, wherein a fourth portion of the RAM blocks stores channel messages corresponding to variable nodes of said one sub-code, and wherein said each sub-decoder is configured such that each of the RAM blocks in the fourth portion is read by said sub-decoder and loaded only after decoding of the channel messages is finished.

8. The decoder of claim 1, wherein each of the CNPs comprises parallel processing units that are look-up table (LUT) arrays with parallel routing.

9. The decoder of claim 1, wherein each of the VNPs comprises parallel processing units that are adder arrays.

* * * * *